United States Patent [19]

Zorinsky et al.

[11] Patent Number: 4,810,667

[45] Date of Patent: Mar. 7, 1989

[54] DIELECTRIC ISOLATION USING ISOLATED SILICON BY LIMITED ANODIZATION OF AN N+ EPITAXIALLY DEFINED SUBLAYER IN THE PRESENCE OF A DIFFUSION UNDER FILM LAYER

[75] Inventors: Eldon J. Zorinsky; David B. Spratt, both of Plano; Richard L. Yeakley, Dallas, all of Tex.

[73] Assignee: Texas Instruments Incorporated, Dallas, Tex.

[21] Appl. No.: 43,510

[22] Filed: Apr. 28, 1987

[51] Int. Cl.$^4$ ............................................... H01L 29/70
[52] U.S. Cl. ............................................... 437/62; 437/67; 437/71; 437/72; 437/33
[58] Field of Search ........................ 204/34.5, 15, 38.3; 437/71, 33, 243, 62, 72

[56] References Cited

U.S. PATENT DOCUMENTS

| 3,944,447 | 3/1976 | Magdo et al. | 156/7 |
| 4,104,090 | 8/1978 | Pogge | 156/643 |
| 4,628,591 | 12/1986 | Zorinsky et al. | 156/647 |
| 4,643,804 | 2/1987 | Lynch et al. | 204/15 |

OTHER PUBLICATIONS

Holmstrom et al., Appl. Phys. Lett. 42 (04), (Feb. 1983), pp. 386-388.

Primary Examiner—Olik Chaudhuri
Attorney, Agent, or Firm—George L. Craig; James T. Comfort; Melvin Sharp

[57] ABSTRACT

The disclosure relates to a method of forming an isolated semiconductor, preferably of the vertical bipolar variety, wherein a porous highly doped semiconductor layer is oxidized and, with a trench containing silicon oxide therein, forms a region encasing a moderately doped epitaxial layer disposed beneath a lightly doped epitaxial layer. The vertical bipolar device is formed in the moderately doped and lightly doped layers with the highly doped epitaxially deposited layer, which is now a silicon oxide layer, forming a portion of the isolation. The anodization of the highly doped layer takes place using an anodizing acid at a temperature of from about 0 to about 10 degrees C.

9 Claims, 1 Drawing Sheet

DIELECTRIC ISOLATION USING ISOLATED SILICON BY LIMITED ANODIZATION OF AN N+ EPITAXIALLY DEFINED SUBLAYER IN THE PRESENCE OF A DIFFUSION UNDER FILM LAYER

BACKGROUND OF THE INVENTION

1. Field of the Invention

This invention relates to silicon on insulator technology and, more specifically, to formation of vertical silicon bipolar transistor structures in a completely isolated silicon region on a silicon substrate.

2. Brief Description of the Prior Art

Thre have been many approaches described in the prior art pertaining to the formation of completely isolated semiconductor devices. Such approaches have included (1) the implantation of oxygen and (2) the conversion of silicon to a porous layer by electrochemical anodization with subsequent oxidation of the porous silicon layer to form an oxide underlayer, as well as other approaches, the former approach being the most popular. Examples of the above noted second approach are set forth in Pat. No. 4,628,591, Ser. No. 810,001, filed Dec. 17, 1985 of R. S. Keen and Ser. No. 806,258, filed Dec. 6, 1985 of E. Zorinsky, all of which are incorporated herein by reference. The technique utilized in these references employs two successively grown epitaxial layers. The first epitaxial layer, which is heavily doped, serves as the anodizable layer which is then oxidized and the second epitaxial layer, which is less heavily doped, provides the isolated silicon in which MOS or bipolar transistors are built.

Typically, the starting material in the prior art has been P-type, though N-type has also been suggested. Generally, in the prior art N-type technology, an N-type <100> silicon substrate is provided which has been doped to about 2 to 3 ohm-cm. and on which is formed a heavily doped N+ first epitaxial layer with a lesser doped second epitaxial layer formed thereover. A layer of silicon nitride is then formed on the second epitaxial layer to operate as an anodization mask and a silicon oxide layer is then deposited over the nitride and serves as a mask for the later trench etch.

In the present invention, a trench etch is then performed down to the substrate to expose the heavily doped N+ layer. The slice is then placed in the anodization system of the type shown in the above noted U.S. Pat. No. 4,628,591 where the heavily doped N+ layer is selectively porously anodized. Neither the moderately doped N+ layer nor the lightly doped N-type layer are affected. The heavily doped porously anodized layer is oxidized to the exclusion of the other two layers because the porous layer has a much greater differential oxidation rate than does the bulk silicon due to the substantially larger surface area available therein for such oxidation. Accordingly, the single crystal silicon in the porous layer is oxidized with a sidewall oxide then being formed on all exposed walls in the trench. Oxide is also formed on the substrate. The mask is then removed, the trench is filled with silicon oxide and the device surface is planarized. The result is the in situ formation of an isolated silicon structure having a buried collector already in place.

Previous approaches to dielectric isolation via oxidized porous silicon have been unable to provide the control necessary to isolate thick tubs, e.g., those in excess of 0.5 microns or layered structures, such as those which are necessary for certain bipolar applications.

It is desired to form bipolar semiconductor devices of the above described type and particularly in an N-type substrate.

SUMMARY OF THE INVENTION

In accordance with the present invention, the above noted problems of the prior art are minimized and there is provided a vertical bipolar semiconductor structure, in an N-type substrate, if desired, with oxide isolation on all sides and the bottom of the semiconductor region in which the device is formed, thereby forming an island in the substrate containing the semiconductor device.

Briefly, in accordance with the present invention, the prior art is altered by adding an interposing epitaxial layer of silicon between the first and second layers of the prior art, the added layer being doped to a level intermediate the first and second layers. By taking advantage of the current-voltage behavior exhibited by layers doped at different levels, it is possible, by precisely controlling the anodization parameters, to anodize the highly doped layer, while not anodizing the third intermediately doped or the second lightly doped layers. In so doing, the porous anodized/oxidized silicon approach to dielectric isolation is extended to films of thicknesses and doping profiles heretofore unattainable using conventional methods. Furthermore, the approach utilized herein could be extended to even more epitaxial layers than the three discussed herein to provide other novel structures.

The device is formed by initially providing a <100> N-silicon substrate onto which is epitaxially deposited a first highly doped N++ layer having a doping concentration of $1 \times 10^{18}$ to $\times 10^{19}/cm^3$ and preferably at least $2 \times 10^{18}$. The next epitaxial N+ layer is then epitaxially formed thereover which is moderately doped, having a doping concentration of $1 \times 10^{17}$ to $1 \times 10^{18}$ and preferably $1 \times 10^{18}$. The second epitaxial N-type layer is then epitaxially formed thereover which is lightly doped, having a doping concentration of $1 \times 10^{15}$ to $2 \times 10^{16}$ and preferably $1 \times 10^{16}$. The prior art procedures of masking the substrate with silicon nitride and then silicon oxide and then etching a trench down to the substrate is then performed. The trench completely surrounds the region which will later be isolated in conjunction with the silicon dioxide layer formed in the highly doped layer.

The device is then placed in an anodizing bath having an HF solution of the type noted hereinabove as prior art to make the first highly doped layer porous except that the HF is maintained at a temperature of about 0 to 10 degrees C. to reduce leakage currents and sharpen the diode breakdown characteristics associated with the doping levels of each of the layers. This serves to make it easier to precisely control the anodization and selectivity of the layer to be anodized and is a key to this approach. The sidewalls of the trench and surface of the substrate are then oxidized to form a sidewall oxide on the trench sidewalls and an oxide layer on the substrate surface. The trench is then filled with silicon dioxide and the surface of the device is planarized. The mask is removed and a bipolar transistor is formed on the island using the second and third epitaxial layers with the first epitaxial layer, now oxidized, insulating and isolating the island from the remainder of the substrate.

In addition, novelty herein also lies in the use of reduced temperature acid to provide an added means to precisely control the anodization to permit the fabrication of thick isolated islands and/or isolated layered structures having doping profiles suitable for fabricating conventional bipolar transistors. The anodization has been modified over the prior art as noted hereinabove by the addition of a heat exchanger that enables the acid solution to be cooled to about 0 to 10 degrees C. for reasons set forth hereinabove. Cooling of the anodizing solution also reduces the etch rate of the anodizing mask, thereby making it easier to isolate larger features by simply increasing the anodization time.

DESCRIPTION OF THE PREFERRED EMBODIMENT

Referring now to the FIGURES, there is shown in schematic form the device formed herein at various stages in its formation with reference to the processing steps required in such device formation.

Figure 1A:
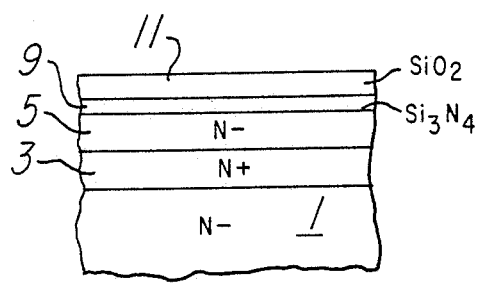
FIGS. 1a through 1e are schematic diagrams showing the structure of the subject invention at various stages of the process herein.

Referring first to FIG. 1a, the initial starting material is an N- <100> silicon substrate 1. A very heavily doped N++ layer of silicon 3 having an impurity concentration of $2 \times 10^{18}$ and thickness of 0.5 micron is epitaxially deposited on the substrate. This is followed by the epitaxial deposition thereon of a moderately doped silicon layer 5 having an impurity concentration of at least $1 \times 10^{17}$ and a thickness of 2.5 microns. A further lightly doped layer 7 of epitaxially deposited silicon is then formed over the layer 5 having an impurity concentration of $1 \times 10^{16}$ and a thickness of 1.3 microns. Masking layers of silicon nitride 9 having a thickness of 1000 angstroms and silicon dioxide 11 having a thickness of 6500 angstroms are then formed over the lightly doped layer 7.

Figure 1B:
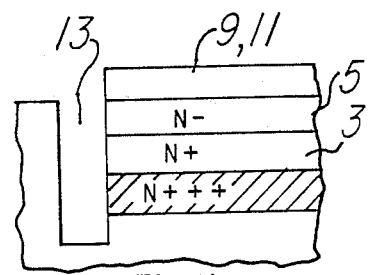

Referring now to FIG. 1b, a resist layer (not shown) is then patterned onto the mask layers 9 and 11 to define the trench locations and pattern the masking layer by etching therethrough. The masking layer then acts as a further mask to permit etching of the trenches 13 through the silicon layers into the substrate. Chlorine based RIE is a preferred etchant. Reference is made to the application of M. Douglas, Ser. No. 730,701, filed May 3, 1985, for other etchants which can be used. The device is then placed in a cold HF anodizing solution (5 degrees C.) in an anodizing chamber as discussed hereinabove to selectively anodize the most heavily doped layer 3 to provide the structure as shown in FIG. 1b.

Figure 1C:
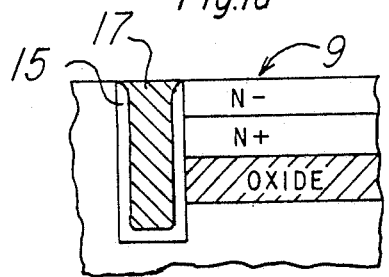

Referring now to FIG. 1c, the anodized layer 3 is thermally oxidized to form silicon dioxide with a sidewall oxide 15 being thermally grown on all of the side walls of the trench 13 including the substrate 1. The remainder of the trench 13 is filled with silicon dioxide 17 which is deposited therein in standard manner and the surface 19 of the entire device is planarized after removal of the masking layer 9, 11. This provides the structure required to begin construction of an active device in the island.

Figure 1D:
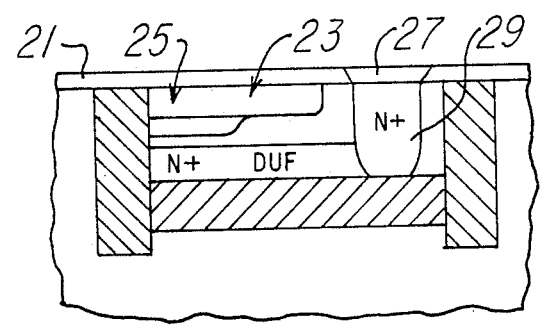

Referring now to FIG. 1d, initially a protective layer 21 in the form of a field oxide is formed on the surface of the device. A P-type base layer 23 is then implanted in a portion of the island in the layer 7 which does not extend to the layer 5 through the oxide 21. A further extrinsic base implant 25 is implanted into a portion of the base region which has a lower sheet resistivity higher doping concentration region which extends the base in that region slightly deeper into the layer 7. An opening 27 is then created in the oxide 21 to the side of the base region 23 and a heavy N-type dopant impurity is implanted therein to form an N+ deep collector 29 which extends to the layer 5 to provide a collector contact region at the opening 27.

Figure 1E:
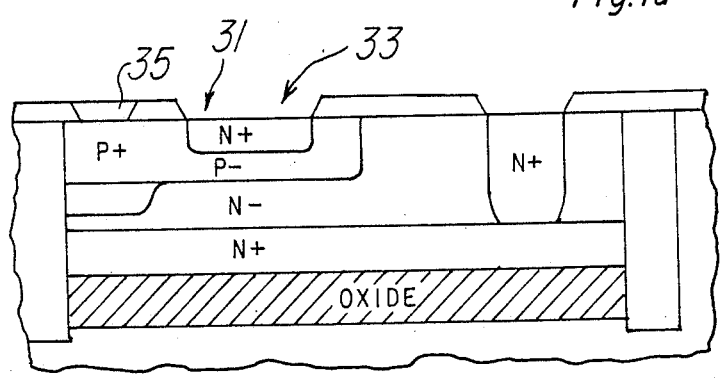

Referring now to FIG. 1e, a region of the oxide layer 21 is opened at 31 to form an emitter region and an N+ implant is provided in this opening to form the emitter 33. Also, an opening 35 is formed in the oxide layer 21 to provide a contact region for the base 23. Appropriate metallization and interconnects are patterned and deposited in the regions 27, 31 and 35 to provide contacts the the emitter, base and collector of the vertical bipolar transistor which has been fabricated.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method for forming a bipolar transistor in an isolated epitaxial island on an n-type silicon substrate, comprising the steps of:
   (a) forming a first highly doped n-type epitaxial silicon layer on said substrate;
   (b) forming a second moderately doped n-type epitaxial silicon layer on said highly doped epitaxial silicon layer;
   (c) forming a third lightly doped n-type epitaxial silicon layer on said moderately doped epitaxial silicon layer;
   (d) forming a trench extending through each of said first, second and third layers and into said substrate;
   (e) exposing said substrate to an anodizing agent maintained at a temperature from about 0 to about 10 degrees C and a voltage whereby porous silicon is selectively formed only in the said first highly doped layer;
   (f) oxidizing the porous silicon to form silicon dioxide in the porous layer; and
   (g) forming a semiconductor device in said second and third layers.

2. The method of claim 1 further including the step of forming a sidewall oxide in said trench.

3. The method of claim 1 further including the step of filling said trench with silicon oxide.

4. The method of claim 2 further including the step of filling said trench with silicon oxide.

5. The method of claim 1 further including forming an oxide layer over said substrate prior to step (g); forming a collector contact region in said first layer extending to said second layer and forming base and emitter regions in said first layer.

6. The method of claim 2 further including forming an oxide layer over said substrate prior to step (g); forming a collector contact region in said first layer extending to said second layer and forming base and emitter regions in said first layer.

7. The method of claim 3 further including forming an oxide layer over said substrate prior to step (g); forming a collector contact region in said first layer extending to said second layer and forming base and emitter regions in said first layer.

8. The method of claim 4 further including forming an oxide layer over said substrate prior to step (g); forming a collector contact region in said first layer extending to said second layer and forming base and emitter regions in said first layer.

9. The method of claim 1 wherein said highly doped N-type layer has a thickness of about 0.5 microns.

* * * * *